United States Patent [19]
Berding

[11] Patent Number: 5,696,667
[45] Date of Patent: Dec. 9, 1997

[54] BACKPLANE FOR HIGH SPEED DATA PROCESSING SYSTEM

[75] Inventor: Andrew R. Berding, Scottsdale, Ariz.

[73] Assignee: Arizona Digital, Inc., Scottsdale, Ariz.

[21] Appl. No.: 632,648

[22] Filed: Apr. 15, 1996

[51] Int. Cl.$^6$ ............................................. H05K 1/14
[52] U.S. Cl. ..................... 361/788; 361/777; 361/803; 439/61; 439/59
[58] Field of Search ............................. 361/679, 686, 361/733, 777, 791, 788, 796, 803; 439/61, 59

[56] References Cited

U.S. PATENT DOCUMENTS

| | | | |
|---|---|---|---|
| 3,267,394 | 8/1966 | Peil et al. | 333/8 |
| 4,679,872 | 7/1987 | Coe | 439/61 |
| 4,697,858 | 10/1987 | Balakrishnan | 439/61 |
| 4,738,632 | 4/1988 | Schmidt et al. | 439/341 |
| 5,060,111 | 10/1991 | Takashima | 361/384 |
| 5,091,822 | 2/1992 | Takashima | 361/84 |
| 5,119,273 | 6/1992 | Corda | 361/413 |
| 5,122,691 | 6/1992 | Balakrishnan | 307/475 |
| 5,175,515 | 12/1992 | Abernathy et al. | 333/4 |
| 5,210,682 | 5/1993 | Takashima | 361/396 |
| 5,448,208 | 9/1995 | Honjo | 333/128 |
| 5,509,006 | 4/1996 | Saligny | 379/327 |
| 5,568,361 | 10/1996 | Ward et al. | 361/735 |

Primary Examiner—Michael W. Phillips
Assistant Examiner—David Foster
Attorney, Agent, or Firm—Paul F. Wille

[57] ABSTRACT

A data processing system includes a backplane and a plurality of logic boards connected to the backplane by a plurality of connectors. In one embodiment of the invention, a set of common points is electrically coupled to the connectors by individual conductive traces between each common point and the corresponding pins of the connectors. The common points are preferably centrally located among the plurality of connectors to reduce propagation delay. A connector can be attached at the common points. The traces are separated from each other by lateral displacement in a single plane. If the backplane is a multi-layered printed circuit board, the traces are separated from each other by vertical displacement between the layers of the printed circuit board or by both vertical and horizontal displacement. The traces to the connectors nearest the common points have a minimum length greater than the distance between the nearest connectors and the common points.

24 Claims, 3 Drawing Sheets

BACKPLANE FOR HIGH SPEED DATA PROCESSING SYSTEM

BACKGROUND OF THE INVENTION

This invention relates to a backplane for interconnecting a plurality of printed circuit boards in a high speed data processing system, wherein each pin on each board is individually connected to a corresponding common point on the backplane.

It has long been recognized that the most economical and flexible construction for data processing systems utilizes a plurality of printed circuit boards having electrical connections brought out to at least one edge of the board for connection to other boards of like construction by a backplane having a plurality of connectors for receiving the boards. With this construction, the configuration of a data processing system can be changed easily by adding or removing boards.

As used herein, "data processing system" refers to a group of printed circuit boards on a common backplane, wherein at least one of the boards includes digital logic circuitry. The boards can be, but need not be, identical and can include zero, one, or more microprocessors.

In the art, the backplane is often referred to as a "motherboard," probably as a derivative of "breadboard." The printed circuit boards attached to the backplane are often referred to as "daughter boards" or "cards." Because of the shape of the connectors, the term "slot" is used in the art to refer to the connector itself or to refer to the position of a connector on a backplane, e.g. "slot six." There is not actually a long, narrow hole in the backplane. A plurality of traces carrying the same type of signals is known as a bus, e.g. a data bus.

The backplane itself is a printed circuit board in which the connectors are approximately parallel and, in general, each pin of each connector is electrically connected to the corresponding pin of every other connector by a conductive run or "trace" among the connectors. For example, pin one in the first connector is connected to pin one of every other connector by a trace threading its way down the length of the backplane. In the early days of the microprocessor, a single layer of traces interconnecting ten or twenty connectors was sufficient. As microprocessors became faster, this construction was no longer adequate and multi-layer sandwiches of traces became necessary.

Each microprocessor has an internal clock that synchronizes the operation of the various portions of the microprocessor, e.g. internal logic, address lines, and data lines, and defines the minimum period in which operations can take place. While not a true indicator of the speed of a microprocessor, the clock frequency provides a simple way to compare microprocessors. A greater difficulty with clock frequency is that the signals in a microprocessor are square wave pulses, not sinusoidal signals. As shown by the mathematician Fourier, a square wave of a given frequency is the sum of a sine wave of the same frequency (the fundamental) and the odd harmonics of the fundamental. Thus, the pulses in a backplane contain components of significantly higher frequency than the nominal clock frequency. The result is that the traces become transmission lines having complex, frequency dependent, impedance characteristics.

If the clock frequency is low, e.g. one megahertz, the parallel lines in a backplane exhibit some coupling, known as cross-talk, i.e. the traces act like miniature antennas, transmitting and receiving signals. This coupling is minimal and the system functions despite the distortions that the coupling introduces into the signals on the traces. Even though the traces are actually transmission lines, the traces can be considered lumped capacitances and inductances at low frequency. If, on the other hand, the clock frequency is on the order of tens of megahertz, the problems of coupling can no longer be ignored and the prior art has used a number of techniques for addressing the problem, e.g. grounding alternate traces to minimize coupling. At a clock frequency on the order of one hundred megahertz, the problems are severe and the traces must be considered transmission lines, with the attendant problems of reflections and terminations.

A square wave pulse is usually considered to have vertical edges and a constant amplitude top. In fact, this ideal is physically impossible to attain, although one can appear to approach the ideal, depending upon how closely one inspects the waveform. For example, a conductive trace of any length exhibits a nominal capacitance. The time required to charge that capacitance to a given voltage depends upon the available current. Increasing a trace from zero volts to five volts (or any voltage) in zero time requires infinite current. Thus, the leading edge and the trailing edge of any square wave pulse necessarily have a finite slope ($\Delta v/\Delta t$) and this slope limits the maximum speed of operation of a data processing system and is independent of the clock frequency. On the other hand, it is advantageous to reduce the slopes of the leading and trailing edges of a pulse to reduce the amplitude of the high frequency components of the pulse because even very short traces can radiate significant amounts of energy at very high frequencies. Reducing the slope of the leading edge and the slope of the trailing edge reduces the amount of electromagnetic interference (EMI) caused by a backplane.

A simple rule of thumb is that a trace can be considered a lumped impedance if both the rise time ($\Delta t_r$) and the fall time ($\Delta t_f$) of a pulse are longer than the round trip propagation time of the pulse. If not, the trace must be considered a complex transmission line, i.e. the capacitances and inductances are distributed along the trace and must be evaluated at a plurality of points to determine the effect of the trace on a pulse traveling along the trace (and being reflected back).

Because each trace is a transmission line, each unterminated end of a trace is an abrupt change in medium that reflects a signal, in much the same way as sound will echo from a wall or other abrupt change in its path. It is known in the art to terminate each trace on a backplane with what is believed to be the characteristic impedance of the trace, e.g. fifty ohms. Such termination minimizes the reflections of a signal from the ends of the trace by absorbing the incident energy and making the ends of the trace seem to disappear (be infinitely far away). If a significant fraction of the signal is reflected at the end of the trace, the actual voltage at any connector can be unpredictable.

It has been found that the value of the resistance required to terminate each trace is based upon an assumption that is not always true, i.e. the impedance of a trace is not a constant and depends upon the number and type of connectors, the number and type of boards connected to the backplane, the lengths of the metal tabs on the boards (which act like tuning stubs at high frequency), and the amount of capacitance represented by each semiconductor device connected to the trace. A very lightly loaded backplane (having only one or two connectors filled) may exhibit an effective characteristic impedance of seventy-five ohms. A heavily loaded backplane (all connectors filled) may exhibit an effective characteristic impedance as low as twenty-five ohms. Therefore, a fixed termination of fifty ohms cannot satisfy either circumstance and reflections are inevitable due to the impedance mismatches at the ends of a trace.

Terminating the ends of a trace adds resistors in parallel with the trace, thereby increasing the load on the circuit trying to change the voltage on the trace, i.e. increasing the amount of current necessary to charge the trace to a given voltage in a given time. If a backplane has a 50Ω resistor connected to each end of a trace and the supply voltage is 3.0 volts, a drive current of 120 ma. is necessary. Commercially available drivers are unable to provide the current required by such terminations.

Unfortunately, "termination" has two different meanings in the data processing art. "Termination" is used above in the RF sense of a resistor matching the impedance of a transmission line. This typically severely loads the trace, requiring more current than conventional drivers can provide.

Another meaning of "termination" relates to simple pull-up resistor networks. A trace is terminated by being connected to the junction of two resistors that are connected in series between supply and ground. This form of termination provides current and a load for an open collector device. At a minimum, a "pull-up" resistor (a resistor connected between an open collector and the supply voltage) is required.

A VME (Versa Module European, a widely used industrial standard) termination is a 330Ω resistor connected to +5 volts and a 470Ω resistor connected to ground, with a trace connected to the junction of the resistors. It can be shown that this is equivalent to a 194Ω resistor connected to a supply voltage of 2.94 volts, corresponding to a maximum current of about 15 milliamperes. Because each end of a trace is terminated, this requires a current of 30 milliamperes from a driver. The VME specification requires that drivers be able to sink a current of 48 milliamperes, leaving only 18 milliamperes to charge the capacitance of a trace. A VME termination is a very poor RF termination because the resistances are too high to absorb very much incident energy.

It is known in the art to use "active" termination in which circuitry at each end of the backplane senses the voltage on each trace and attempts to supply current as necessary to raise or lower the voltage on the trace. This is feasible at low clock frequencies but is not feasible at high clock frequencies because of the inevitable delay in sensing and responding.

At high clock frequencies, the traces on a backplane cause a delay that can become a significant fraction of a clock period. For example, a trace forty centimeters long can delay a pulse by eight to ten nanoseconds or one period of a 100 megahertz clock. The difference in the arrival times of a signal at different connectors is called skew. If all connectors are being driven by a common clock, skew can severely limit the rate at which data is transmitted between boards connected to the backplane. It is known in the art to arrange the boards in a circle to minimize path length but this configuration is difficult to construct. It is preferred to have a planar or "linear" backplane.

It is often desired, particularly in communication systems, to add or remove a board while the system is running, i.e. a "hot" change. In most data processing systems, adding or removing a board while the system is running causes an abrupt change in voltage and information is lost. For example, if a board is added to a system, the capacitances of the board are initially at zero voltage. Inserting the board typically brings the traces to zero volts momentarily. If the board is inserted while signals are being sent between existing boards, the signals are corrupted.

In view of the foregoing, it is therefore an object of the invention to provide a backplane for data processing systems that operate at a clock frequency of 40 MHz. or more.

Another object of the invention is to provide a linear backplane having minimal reflections.

A further object of the invention is to provide a backplane that can be driven by conventional bus drivers.

Another object of the invention is to provide a backplane that can tolerate "hot" changes.

A further object of the invention is to provide a backplane that produces less EMI than backplanes of the prior art.

Another object is to provide a backplane having minimal skew.

A further object of the invention is to provide a backplane that is less susceptible to external EMI than backplanes of the prior art.

Another object of the invention is to minimize cross-talk between signals on separate traces.

A further object of the invention is to provide a backplane that is mechanically and electrically compatible with existing backplanes, i.e. that can be substituted for existing backplanes.

Another object of the invention is to provide a backplane in which the conductive traces are joined at a point to cause the circuit to act like a lumped impedance rather than a distributed impedance.

A further object of the invention is to eliminate RF terminations from a backplane for a high speed data processing system.

Another object of the invention is to provide a backplane in which the conductive traces are joined at a point to cause the circuit to act like a series inductance and a shunt capacitance for eliminating reflections.

A further object of the invention is to provide a backplane in which the conductive traces are joined at a point to cause the circuit to act like a series inductance and a shunt capacitance which substantially attenuates noise.

Another object of the invention is to provide a backplane that is immune to open collector glitches.

SUMMARY OF THE INVENTION

The foregoing objects are achieved in this invention in which a data processing system includes a backplane and a plurality of logic boards connected to the backplane by a plurality of connectors. In one embodiment of the invention, a set of common points is electrically coupled to the connectors by individual conductive traces between each common point and the corresponding pins of the connectors. The common points are preferably centrally located among the plurality of connectors to reduce propagation delay. In another embodiment of the invention, there is a connector at the common points.

As used herein, "point" does not refer to a location of zero size but to a finite region in a conductive layer of a printed circuit board. The region is preferably circular or annular, although the region merges with the traces intersecting the point and may have some other shape.

In accordance with another aspect of the invention, the traces are separated from each other by lateral displacement in a single plane. In an alternative embodiment of the invention, the backplane is a multi-layered printed circuit board and the traces are separated from each other by vertical displacement between the layers of the printed circuit board or by both vertical and horizontal displacement.

In accordance with yet another aspect of the invention, the traces to the connectors nearest the common points have a minimum length greater than the distance between the nearest connectors and the common points.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
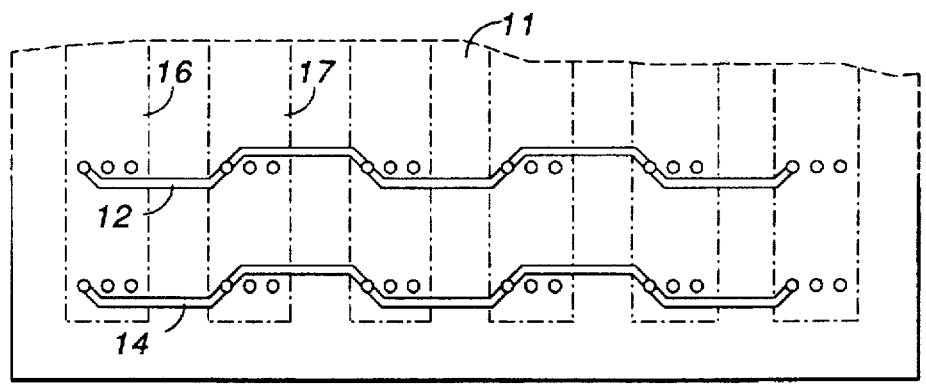
FIG. 1 is an plan view of a backplane and printed circuit boards constructed in accordance with the prior art.

FIG. 1 is a plan view of a typical backplane of the prior art. Backplane 11 includes conductive traces 12 and 14 interconnecting the corresponding pins of each connector, such as connectors 16 and 17. Note that the traces stitch from one connector to the next seriatim. Logic boards, not shown, are attached to the backplane by the connectors. A connector is a discontinuity in the trace, having a different impedance from the trace itself, and can be a source of reflection. Further, a connector can exhibit at least two, radically different impedances, a first impedance when a logic board is present and a second impedance when no board is present.

Figure 2:
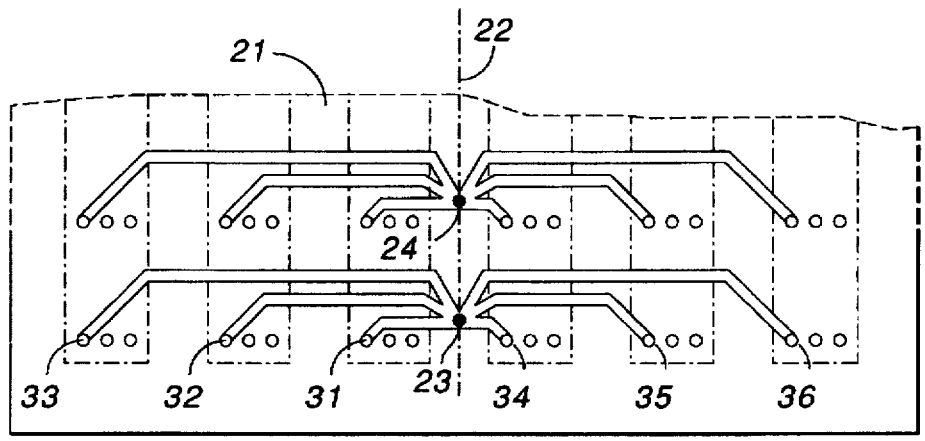
FIG. 2 is a plan view of a backplane constructed in accordance with a preferred embodiment of the invention.

FIG. 2 is a plan view of a backplane constructed in accordance with the invention. Backplane 21 includes a plurality of connector pins arranged in an array of rows and columns, with the connector for a given board including a column three pins wide. The pins for each connector can be encased in a suitable plastic or left separate. The reference to rows and columns is for the sake of convenience in describing the invention and is not intended as a constraint upon the arrangement of the pins.

Common point 23, common point 24, and the other common points along centerline 22 define a set of common points for the connectors. Unlike the prior art, in which a pin of one connector is connected to the corresponding pins of the adjacent connectors, each pin is connected by a separate trace to a common point. For example, in the bottom row of pins, the left-hand pin of each connector is connected to common point 23 in the center of backplane 21 by a separate trace emanating from common point 23. Specifically, there is a trace from common point 23 to pin 31; there is a separate trace from common point 23 to pin 32; there is a separate trace from common point 23 to pin 33; there is a separate trace from common point 23 to pin 34; there is a separate trace from common point 23 to pin 35; there is a separate trace from common point 23 to pin 36; and so on, for all pins on all connectors. Common point 24 is connected in the same way to the left-hand pins in the second row, as are the remaining pins on the backplane that are to be connected together. (In some applications, not all pins are connected to all corresponding pins.)

Connecting the pins by individual traces that join at a common point causes the circuit to act like a simple lumped inductance and capacitance rather than as a complex transmission line. The capacitances of the traces, of the connectors, of the stubs into the boards, and of the semiconductor devices on the boards act as if they were lumped at the common point rather than being distributed along a trace. The lumped capacitance is driven through the lumped inductance of the trace from a driver board. The effective circuit is a series connected inductor and a shunt capacitor to ground at the common point and there are essentially no reflections to degrade a signal. Therefore, RF terminations are not required. Eliminating the RF terminations decreases loading, which allows the traces to be driven by commercially available drivers. Because current is not being drained through the RF terminations, more current is available to drive the traces, enabling the lumped capacitances to be charged somewhat faster.

Unlike backplanes of the prior art, the rise time ($\Delta t$) of a pulse in a backplane constructed according to this invention is slowed by about the same amount at each receiver. (Note that this is the pulse as received, not the pulse as generated.) The rise time is slowed by the attenuation of high frequency components of the pulse. The lumped capacitances of a trace have a low impedance at high frequency, which substantially attenuates noise and attenuates the high frequency components of a pulse.

A slower rise time reduces EMI generated by the backplane and reduces the susceptibility of the backplane to externally generated EMI. A slower rise time also reduces the noise generated when inserting a board into an operating backplane. A momentary pulse produced by a hot insert occurs at the inserted board but the pulse is attenuated by the series inductance and the lumped shunt capacitance before it arrives at the other boards. Therefore, the momentary pulse at the inserted board does not corrupt signals among the existing boards. Cross-talk, another form of noise, is also reduced.

Another source of noise is known as "open collector glitch." An open collector is an output pin on an integrated circuit that is directly connected to the collector of a bipolar transistor within the integrated circuit. The output is intended to sink current, i.e. conduct current from a supply to ground through a load connected between the supply and the output. Such circuits are useful because several outputs can be connected together without conflict. A problem occurs when two open collector transistors are both conducting and then one transistor is turned off. There is a momentary increase in voltage at the output until the remaining transistor begins to carry the full current. The problem is most likely to occur if the two transistors are in boards at opposite ends of a backplane, e.g. on a bus request line. A bus arbiter circuit can become confused and think that no requester needs the bus when there is an open collector pulse. Simulations show that an open collector pulse is also highly damped by a backplane constructed in accordance with the invention.

Yet another advantage of the invention is that a signal from a driver on one board arrives at all the other boards at essentially the same time, no matter which connector is driven, even though the lines are not the same length, because the signal at the common point is connected to each receive pin by a short, lightly loaded line.

In a backplane constructed according to the invention, RF terminations can be eliminated. Voltage terminations (pull-up resistors) cannot be eliminated because an open collector output would be an open circuit and the data processing system would not function. Fortunately, most traces on a backplane do not require pull-up resistors. Traces typically requiring a pull-up resistor are control lines, e.g. bus request, interrupt request, and data acknowledge.

Figure 3:
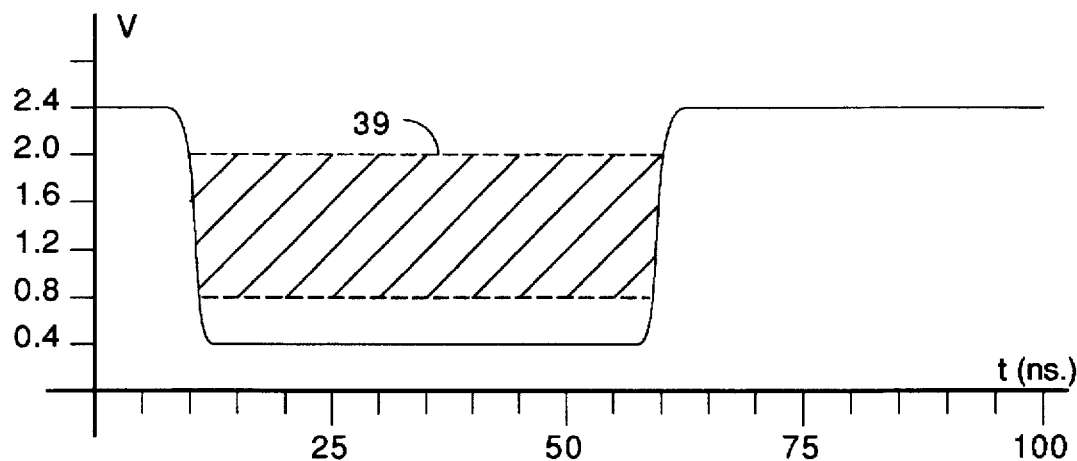
FIG. 3 is a chart of voltage vs. time representing an idealized waveform useful in understanding the operation of the invention.

FIG. 3 illustrates an idealized waveform as defined for a VME backplane having twenty-one connectors. A logic "1" or "high" is defined as a voltage greater than 2.0 volts at the receiver. A logic "0" or "low" is defined as a voltage less than 0.8 volts at the receiver. A voltage in region 39, between 0.8 volts and 2.0 volts is at an indeterminate logic level and logic circuits randomly interpret the voltage as either a logic high or a logic low with unpredictable results. As illustrated in the idealized waveform of FIG. 3, a high to low transition (2.4 to 0.4 volts at the driver) begins at 10.0 ns and ends at 12.5 ns with no overshoot or undershoot. Similarly, a low to high transition begins at 57.5 ns and ends at 60.0 ns with no overshoot or undershoot. The real world is somewhat different.

Figure 4:
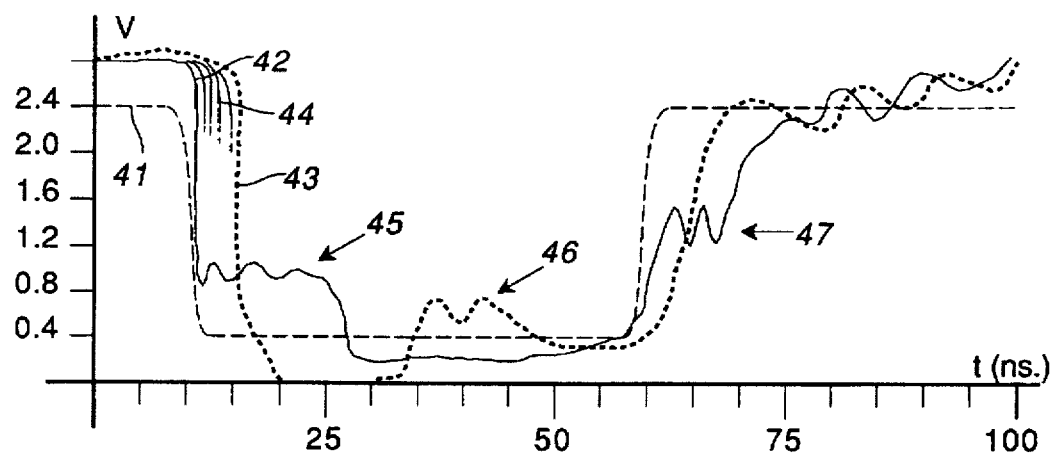
FIG. 4 is a chart of the waveforms on a backplane constructed in accordance with the prior art.

FIG. 4 is a chart of waveforms from a simulation of a VME backplane having all twenty one connectors filled and driven by a board in the first connector. The backplane included undershoot diodes at each receiver to minimize ringing and VME terminations at the end connectors. The ideal waveform is dashed line 41. The signal from the driver board is represented by solid line 42. The signal at the second connector is very nearly identical to line 42 and is not shown separately. The signal at the twenty first connector is represented by dotted line 43. The signals for the other connectors are distributed between signals 42 and 43, as indicated by lines 44.

There are four problem areas. Region 45 in line 42 is above 1.0 volts but should be below 0.8 volts. Region 46 in line 43 indicates reflections on the traces of the backplane and these reflections are additively combining to exceed 0.8 volts. Region 47 shows the voltage vacillating around 1.2 volts when the voltage should be above 2.0 volts. A fully loaded backplane is a heavy load on the drivers for the traces. When only the first connector and the last connector are loaded, the signals are closer in time but the reflected noise remains. Notice the time delay (skew) between when the signal arrives at the second connector (essentially line 42) and at the last (twenty-first) connector (line 43). In this example, the delay is about eight nanoseconds.

Figure 5:
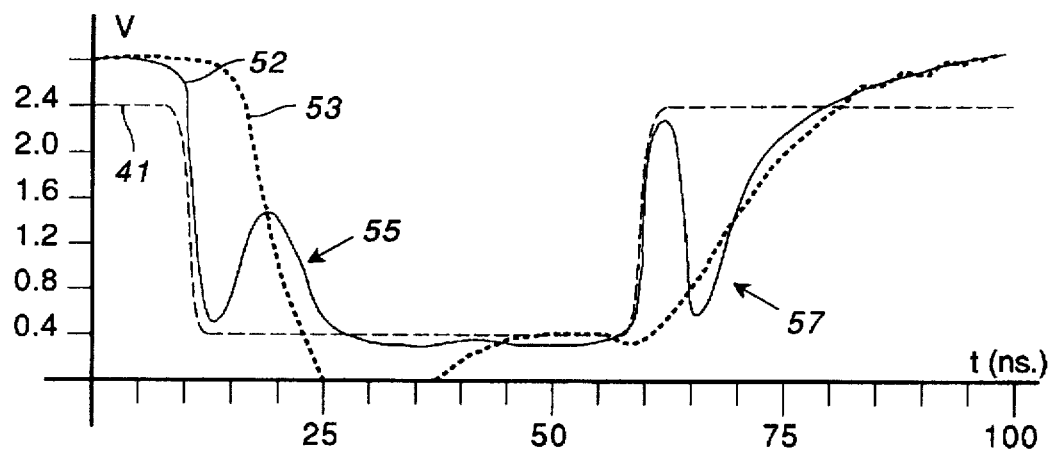
FIG. 5 is a chart of the waveforms on a backplane constructed in accordance with the invention.

FIG. 5 is a chart of waveforms from a simulation of a backplane constructed in accordance with the invention and having all twenty one connectors filled. The backplane included undershoot diodes on each receiver and an undershoot diode at the middle connector and VME terminations at the end connectors. (The VME terminations could have been eliminated but were used to match the test conditions for the backplane from the prior art.) The driver board was located in the first connector, not in the center connector, because this position was found to be "worst case" for a fully loaded backplane. The ideal waveform is dashed line 41. The signal from the driver board is represented by solid line 52. The signals at all the receivers are very nearly identical and are effectively superimposed, as represented by dotted line 53, having essentially no skew.

As seen in FIG. 5, the logic low area is much cleaner, i.e. there are almost no reflections. The peak at 55 and the valley at 57 relate more to the ability of the driver to sink or source current than to the reflections on the line. Waveform 52 is at the driver, therefore the peak at 55 and the valley at 57 do not affect any of the receivers. In effect, the ideal signal is delayed by about 8 ns. This is the same delay as the maximum delay for the prior art VME backplane represented in FIG. 4. Because address and data lines are typically operated over several clock cycles, the delay is not significant.

Although the delay from driver to receiver is not critical, data skew (the variations in delay from receiver to receiver) is critical. In a backplane constructed in accordance with the invention, the minimum and maximum delays are almost the same, resulting in minimal skew, and the backplane can be operated at much higher speed.

Even more significant is the lack of reflections. With backplanes of the prior art, reflections cause a logic level to become indeterminate by producing a voltage between 0.8 and 2.0 volts, resulting in unpredictable operation.

In simulations of the improved backplane with only the first connector and the last connector containing boards, waveform 53 moved closer to waveform 52, peak 55 decreased, and valley 57 was less deep. There were almost no reflections, as was the case with the fully loaded backplane.

Figure 6:
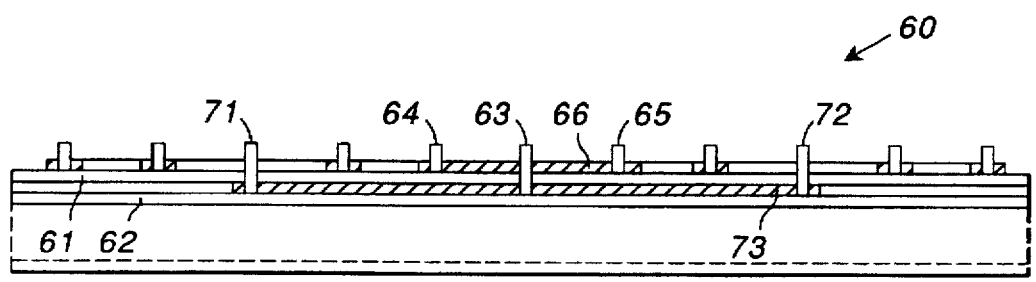
FIG. 6 is a cross-section of a backplane constructed in accordance with an alternative embodiment of the invention.

In FIG. 2, the conductive traces are separated laterally within a given layer of backplane 21. FIG. 6 is a cross-section of a backplane constructed in accordance with an alternative embodiment of the invention in which the traces are separated vertically in a multi-layer printed circuit board. Backplane 60 includes insulating layers 61 and 62 separated by a patterned conductive layer. Common point 63 is coupled to pins 64 and 65 by conductive trace 66. Common point 63 extends through insulating layer 61 and is coupled to pins 71 and 72 by conductive trace 73. Conductive trace 73 is one of a plurality of traces formed in the patterned conductive layer between insulating layers 61 and 62. Common point 63 can be a plated through hole between layers or can be what is known as a Z-bar, a small segment of wire extending between layers.

Backplane 60 includes alternating layers of insulator and conductor stacked in a sandwich structure. The traces on opposite sides of an insulating layer, such as traces 66 and 73, preferably do not overlie each other, thereby minimizing coupling between the traces. The traces are preferably displaced horizontally and vertically to minimize coupling. As with the embodiment of FIG. 2, reflections are minimized by separately coupling each pin in a row to a common point.

Figure 7:
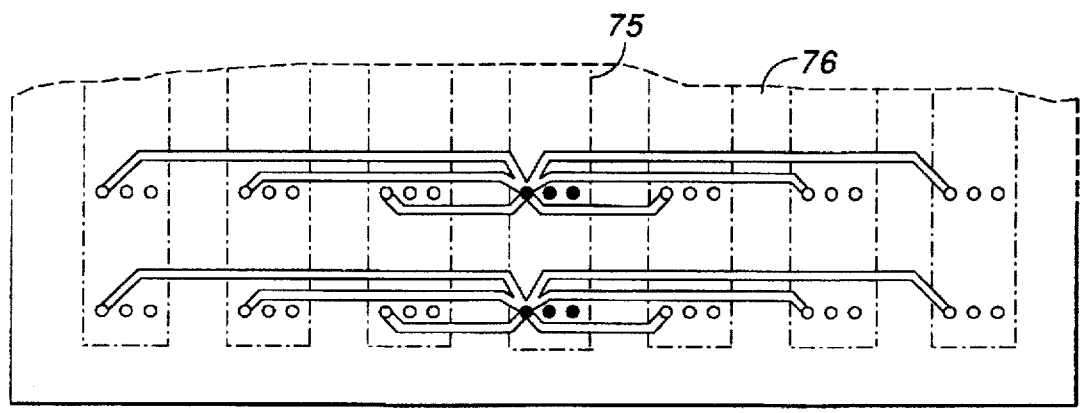
FIG. 7 is a plan view of a backplane constructed in accordance with an alternative embodiment of the invention.

FIG. 7 illustrates a backplane constructed in accordance with an alternative embodiment of the invention in which the common points are the pins of a centrally located connector. Connector 75 is centrally located on backplane 76 and the pins of connector 75 are connected to the remaining connectors as described above for the common points. The change in impedance caused by connector 75 does not adversely affect the operation of backplane 76, i.e. the traces act as lumped impedances and all of the advantages described above apply to this embodiment.

Figure 8:
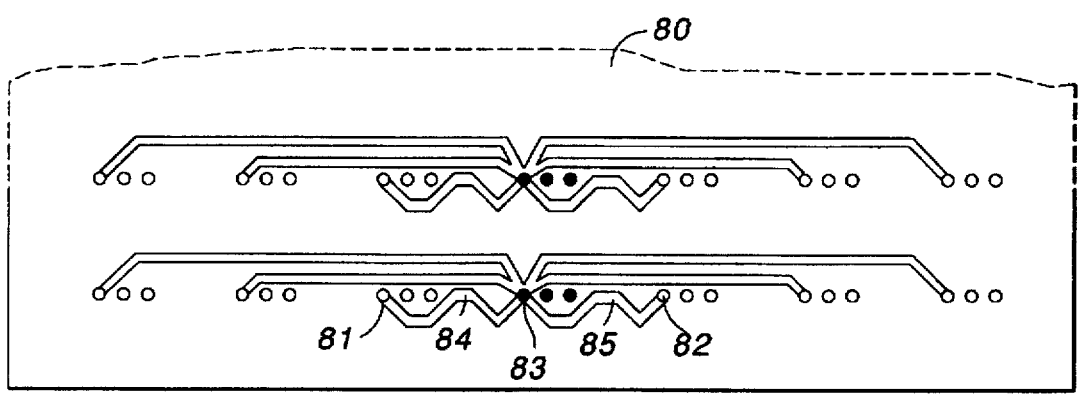
FIG. 8 is a plan view of a backplane constructed in accordance with another aspect of the invention in which the conductive traces have a minimum length greater than the spacing of the connectors.

FIG. 8 illustrates a backplane in which the connectors nearest the common points have a minimum length trace. Intuitively, one might assume that a shorter trace is preferable. It has been found that performance is improved if all the traces are longer than approximately twenty percent of the length of the longest trace, and preferably longer than forty percent of the longest trace. As described above, the lumped series inductance provides EMI immunity and other advantages. The impedance of a trace is dependent, in part, on the length of the trace and, despite being a lumped inductance, the added length improves EMI immunity and other characteristics of the backplane without adversely affecting any of the advantages of a backplane constructed in accordance with the invention.

Figure 9:
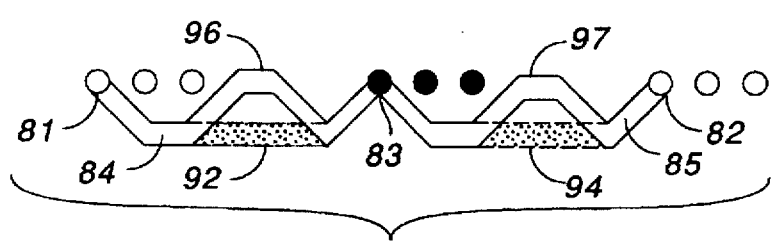
FIG. 9 is an enlarged view of a portion of the backplane in FIG. 8.

FIG. 9 is an enlarged portion of backplane 80. In FIGS. 8 and 9, pin 81 is coupled to common point 83 by trace 84 and pin 82 is coupled to common point 83 by trace 85. Traces 84 and 85 differ from the corresponding traces in FIGS. 2 and 7 by including a meander to increase the length of each trace. Stated another way, the traces follow a non-optimal or non-minimal path from common point 83 to the pins of the connectors. As shown in FIG. 9, an optimal path from pin 81 to common point 83 includes a portion of trace 84 and stippled area 92. Similarly, an optimal path from pin 82 to common point 83 includes a portion of trace 85 and stippled area 94. It is easily shown that meander 96 is longer than stippled area 92 and that meander 97 is longer than stippled area 94.

The invention thus provides a backplane for data processing systems that operate at a clock frequency of 40 megahertz or more with minimal reflections. The backplane minimizes reflections by individually connecting each board to a set of common points and reduces propagation delays by centrally locating the common points. Boards can be changed "hot" because the change in voltage affects only the traces to the board being added. By the time a noise signal arrives at the common points, the signal has been attenuated enough to avoid damaging data. EMI immunity is enhanced and EMI emissions are reduced.

Having thus described the invention, it will be apparent to those of skill in the art that various modifications can be made within the scope of the invention. For example, although described as planar to distinguish from other types of backplanes, a backplane constructed in accordance with the invention need not be perfectly flat; e.g. the backplane could be curved to splay the logic boards for decreased coupling between the boards or for better cooling. It is preferred that the common points be centrally located on a backplane but a non-central location could be used instead. The common points need not be arranged in the same manner as the pins on a connector but can be arrayed as convenient, e.g. to simplify the routing of the conductive traces. Although the meanders are illustrated in FIG. 8 as located in a common layer with the remainder of the traces, the meanders can be implemented by changing layers in a multi-layer board. As previously indicated, not all pins are connected to a common point in some applications. For example, the pins designated "bus grant" and "interrupt acknowledge" are daisy chained from one card to another.

What is claimed as the invention is:

1. A data processing system including a backplane and a plurality of logic boards each connected to said backplane, wherein said backplane comprises:
   a printed circuit board;
   a plurality of connectors attached to said backplane for receiving said logic boards, each of said connectors having a plurality of pins;
   a plurality of common points; and
   a plurality of conductive traces for electrically coupling a pin from each connector to one of said common points by individual traces, respectively, to cause a lumped impedance characteristic at each common point.

2. The data processing system as set forth in claim 1 wherein said common points are located approximately centrally on said backplane.

3. The data processing system as set forth in claim 1 wherein each trace to a common point is separated from other traces to the common point by lateral displacement in the plane of the trace.

4. The data processing system as set forth in claim 1 wherein said printed circuit board is a multi-layered board and wherein each trace to a common point is separated from other traces to said common point by vertical displacement between the layers of said multi-layered board.

5. The data processing system as set forth in claim 1 wherein said printed circuit board is a multi-layered board and wherein each trace is separated from the other traces by vertical displacement between the layers of said printed circuit board and by lateral displacement within a layer.

6. The data processing system as set forth in claim 1 wherein the connectors nearest said common points are coupled to said common points by traces including a meander.

7. The data processing system as set forth in claim 1 and further comprising:
   a connector attached to said common points.

8. In a data processing system having a plurality of logic boards connected to a backplane, said backplane having a plurality of connectors for receiving said logic boards, said connectors interconnected by conductive traces between corresponding pins of said connectors, the improvement comprising:
   a plurality of common points electrically coupled to the connectors by individual traces between each common point and the corresponding pins of the connectors.

9. The data processing system as set forth in claim 8 wherein said common points are located approximately centrally among said plurality of connectors.

10. The data processing system as set forth in claim 8 wherein said individual traces are separated by lateral displacement.

11. The data processing system as set forth in claim 8 wherein said backplane is a multi-layered, printed circuit board and wherein said individual traces are separated by vertical displacement between the layers of said printed circuit board.

12. The data processing system as set forth in claim 8 wherein said backplane is a multi-layered, printed circuit board and wherein said individual traces are separated by vertical displacement between layers of said printed circuit board and by lateral displacement within a layer.

13. A backplane for a high speed data processing system, said backplane comprising:
   a printed circuit board;
   a plurality of pins;
   a set of common points; and
   a plurality of conductive traces between each common point and the corresponding pin of a column for electrically coupling the pins in a column to a common point by an individual trace to cause a lumped impedance characteristic at each common point.

14. The data processing system as set forth in claim 13 wherein the pins nearest the common points are coupled to a common point by a trace including a meander.

15. A backplane as set forth in claim 13 wherein said pins are arranged in an array of rows and columns.

16. A backplane as set forth in claim 14 wherein said meander increases the length of the trace such that none of the traces is shorter than twenty percent of the length of the longest trace.

17. A backplane as set forth in claim 6 wherein said meander increases the length of the trace to increase the inductance and the capacitance of the trace.

18. A backplane for a data processing system, comprising in combination:
   (a) an insulative substrate;
   (b) a plurality of connectors attached to the substrate, each connector including a plurality of connector conductors;
   (c) a plurality of elongated conductive traces disposed on the substrate, each trace having a first end and a second end, the first end of each trace being electrically connected to one of the connector conductors, respectively; and
   (d) a plurality of common points;
   wherein the traces are grouped corresponding to the common points and each of the second ends of the traces of each group are electrically connected to the common point corresponding to that group, to cause each trace to exhibit a lumped high frequency impedance characteristic at the common point to which that trace is electrically connected.

19. The backplane of claim 18 further including a common connector having a plurality of connector conductors, wherein each common point is electrically connected to a corresponding one of the connector conductors of the common connector.

20. The backplane of claim 18 wherein no impedance-matching termination resistor is electrically connected directly to either the first end or the second end of any of the traces.

21. The backplane of claim 18 wherein no intermediate part of any trace is electrically connected directly to any other connector conductor.

22. A method of avoiding reflections of signals on bus conductors of a backplane in a data processing system, comprising the steps of:
   (a) providing a first group of elongated conductive traces on an insulating substrate, each trace having a first end and a second end;
   (b) applying a plurality of digital pulses to the first ends of the traces, respectively; and
   (c) conducting the digital pulses along the traces to a first common point to which the second ends of all of the traces are electrically connected.

23. The method of claim 22 including the steps of:
   providing a second group of elongated conductive traces on the insulating substrate, each trace of the second group having a first end and a second end,
   applying a plurality of digital pulses to the first ends of the traces of the second group, respectively, and
   conducting such digital pulses along the traces of the second group, respectively, to a second common point to which the second ends of all of the traces of the second group are electrically connected.

24. The method of claim 22 wherein step (b) includes causing the rise times and fall times of the pulses to be longer than the round trip propagation time of an electrical pulse on any of the traces.

* * * * *